United States Patent
Donohoe

(10) Patent No.: US 6,290,806 B1
(45) Date of Patent: *Sep. 18, 2001

(54) PLASMA REACTOR

(75) Inventor: Kevin G. Donohoe, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 08/823,275

(22) Filed: Mar. 24, 1997

Related U.S. Application Data

(60) Continuation of application No. 08/524,249, filed on Sep. 6, 1995, which is a division of application No. 08/048,991, filed on Apr. 16, 1993, now Pat. No. 5,662,770.

(51) Int. Cl.[7] .................................................. C23F 1/02
(52) U.S. Cl. ................... 156/345; 118/723 MR; 118/723 ER
(58) Field of Search ................ 250/531; 279/1; 156/643, 345; 204/298, 190.12, 192.35; 427/38, 562, 563; 361/234; 118/719, 723 E, 723 ER, 723 ME, 723 MP, 723 R, 724; 438/64.1, 513, 225, 10, 14; 216/63; 315/111.21; 359/20; 422/186.05

(56) References Cited

U.S. PATENT DOCUMENTS

| | | | |
|---|---|---|---|
| 3,730,873 | * 5/1973 | Pompei et al. | 204/298 |
| 3,875,068 | * 4/1975 | Mitzel | 250/531 |
| 4,350,578 | 9/1982 | Freiser et al. | 204/192 R |
| 4,492,620 | 1/1985 | Matsuo et al. | 204/192 R |
| 4,645,218 | * 2/1987 | Ooshio et al. | 279/1 |
| 4,786,359 | 11/1988 | Stark et al. | 156/643 |
| 4,793,975 | 12/1988 | Drage | 422/186.05 |
| 4,828,369 | 5/1989 | Hotomi | 350/357 |
| 4,996,077 | * 2/1991 | Moslehi et al. | 427/38 |
| 5,006,760 | 4/1991 | Drake | 315/111.21 |
| 5,087,341 | 2/1992 | Tsukada et al. | 204/192.32 |
| 5,213,658 | 5/1993 | Ishida | 156/643 |
| 5,252,178 | * 10/1993 | Moslehi | 156/643 |
| 5,255,153 | * 10/1993 | Nozawa et al. | 361/234 |
| 5,320,982 | 6/1994 | Tsubone et al. | 437/228 |
| 5,423,918 | * 6/1995 | Gupta et al. | 134/1 |
| 5,494,522 | * 2/1996 | Moriya et al. | 118/719 |
| 5,556,500 | * 9/1996 | Haegawa et al. | 156/345 |
| 5,904,799 | * 5/1999 | Donohoe | 156/345 |

FOREIGN PATENT DOCUMENTS

| | | | |
|---|---|---|---|
| 62030327 | 2/1987 | (JP) . | |
| 5-56939 | * 3/1993 | (JP) | C23C/16/00 |
| 5-92524 | * 4/1993 | (JP) | C23C/16/00 |
| 5-93758 | * 4/1993 | (JP) | C23C/16/00 |
| 6-53176 | * 2/1994 | (JP) | H01L/21/302 |

OTHER PUBLICATIONS

M. Gross et al, "Photoresist etching in a hollow cathode reactor", J.Vac.Sci.Technol. B 8 (6), Nov./Dec. 1990, pp. 1291–1296.*

* cited by examiner

*Primary Examiner*—Gregory Mills
*Assistant Examiner*—Rudy Zervigon
(74) *Attorney, Agent, or Firm*—Howrey Simon Arnold & White, LLP

(57) ABSTRACT

This invention is a hardware modification which permits greater uniformity of etching to be achieved in a high-density-source plasma reactor (i.e., one which uses a remote source to generate a plasma, and which also uses high-frequency bias power on the wafer chuck). The invention addresses the uniformity problem which arises as the result of nonuniform power coupling between the wafer and the walls of the etch chamber. The solution to greatly mitigate the nonuniformity problem is to increase the impedance between the wafer and the chamber walls. This may be accomplished by placing a cylindrical dielectric wall around the wafer. Quartz is a dielectric material that is ideal for the cylindrical wall if silicon is to be etched selectively with respect to silicon dioxide, as quartz it is virtually inert under such conditions.

9 Claims, 4 Drawing Sheets

PLASMA REACTOR

CROSS-REFERENCE TO RELATED APPLICATIONS

This is a continuation application of co-pending U.S. application Ser. No. 08/524,249 filed Sep. 6, 1995; which is a divisional of U.S. Application Ser. No. 08/048,991, filed Apr. 16, 1993, now issued as U.S. Pat. No. 5,662,770.

FIELD OF THE INVENTION

This invention relates to ion-assisted plasma etching of semiconductor wafers in remote source plasma reactors with powered wafer chucks. More particularly, it relates to equipment improvements designed to improve etch uniformity over the surface of a wafer.

BACKGROUND OF THE INVENTION

Integrated circuits are typically fabricated on a wafer of semiconductor material such as silicon or gallium arsenide. During the fabrication process, the wafer is subjected to an ordered series of steps, which may include photomasking, material deposition, oxidation, nitridization, ion implantation, diffusion and etching, in order to achieve a final product.

There are two basic types of etches: ion-assisted etches (also called reactive-ion, plasma or dry etches) and solution etches (also called wet etches). Solution etches are invariably isotropic (omnidirectional) in nature, with the etch rate for a single material being relatively constant in all directions. Reactive-ion etches, on the other hand, are largely anisotropic (unidirectional) in nature. Reactive ion etches are commonly used to create spacers on substantially vertical sidewalls of other layers, to transfer a mask pattern to an underlying layer with little or no undercutting beneath mask segment edges, and to create contact vias in insulative layers.

A plasma etch system (often referred to as a reactor) is primarily a vacuum chamber in which a glow discharge is utilized to produce a plasma consisting of chemically reactive species (atoms, radicals, and ions) from a relatively inert molecular gas. The gas is selected so as to generate species which react either kinetically or chemically with the material to be etched. Because dielectric layers cannot be etched using a direct-current-induced glow discharge due to charge accumulation on the surface of the dielectric which quickly neutralizes the dc-voltage potential, most reactors are designed as radio-frequency diode systems and typically operate at a frequency of 13.56 MHz, a frequency reserved for non-communication use by international agreement. However, plasma etch processes operating between 100 KHz–80 MHz have been used successfully.

The first ionization potential of most gas atoms and molecules is 8 eV and greater. Since plasma electrons have a distribution whose average energy is between 1 to 10 eV, some of these electrons will have sufficient energy to cause ionization of the gas molecules. Collisions of these energized electrons with neutral gas molecules are primarily responsible for the production of the reactive species in a plasma. The reactive species, however, can also react among themselves in the plasma and alter the overall plasma chemistry.

Since plasmas consisting of fluorine-containing gases are extensively used for etching silicon, silicon dioxide, and other materials used in VLSI fabrication, it is instructive to examine the glow-discharge chemistry of $CF_4$. Initially, the only species present are $CF_4$ molecules. However, once a glow discharge is established, a portion of the $CF_4$ molecules dissociated into other species. A plasma is defined to be a partially ionized gas composed of ions, electrons, and a variety of neutral species. The most abundant ionic specie found in $CF_4$ plasmas is $CF_3^+$, such ions being formed by the electron-impact reaction: $e+CF_4 \Rightarrow CF_3^+ +F+2e$. In addition to $CF_4$ molecules, ionic species, and electrons, a large number of radicals are formed. A radical is an atom, or collection of atoms, which is; electrically neutral, but which also exists in a state of incomplete chemical bonding, making it very reactive. In $CF_4$ plasmas, the most abundant radicals are $CF_3$ and F, formed by the reaction: $e+CF_4=>CF_3+F+e$. Radicals are generally thought to exist in plasmas in much higher concentrations than ions, because they are generated at a faster rate, and they survive longer than ions in the plasma.

Plasma etches proceed by two basic mechanisms. The first, chemical etching, entails the steps of: 1) reactive species are generated in the plasma; 2) these species diffuse to the surface of the material being etched; 3) the species are adsorbed on the surface; 4) a chemical reaction occurs, with the formation of a volatile by-product; 5) the by-product is desorbed from the surface; and 6) the desorbed species diffuse into the bulk of the gas. The second, reactive-ion etching, involves ionic bombardment of the material to be etched. Since both mechanisms occur simultaneously, the complete plasma etch process would be better aptly identified as an ion-assisted etch process. The greater the chemical mechanism component of the etch, the greater the isotropicity of the etch.

FIG. 1 is a diagrammatic representation of a typical parallel-plate plasma etch reactor. To perform a plasma etch, a wafer 11 is loaded in the reactor chamber 12 and precisely centered on a disk-shaped lower electrode 13L, thereby becoming electrically integrated therewith. A disk-shaped upper electrode 13U is positioned above the wafer (the number 13* applies to either 13L or 13U). The flow of molecular gas into the chamber 12 is automatically regulated by highly-accurate mass-flow controllers 14. A radio-frequency voltage 15 is applied between electrodes 13L and 13U. Chamber pressure is monitored and maintained continuously through a feedback loop between a chamber manometer 16 and a downstream throttle valve 17, which allows reactions products and surplus gas to escape in controlled manner. Spacing of the electrodes is controlled by a closed-loop positioning system (not shown). At a particular voltage known as the breakdown voltage, a glow discharge will be established between the electrodes, resulting in a partial ionization of the molecular gas. In such a discharge, free electrons gain energy from the imposed electric field and lose this; energy during collisions with molecules. Such collisions lead to the formation of new species, including metastables, atoms, electrons, free radicals, and ions. The electrical discharge between the electrodes consists of a glowing plasma region 18 centered between lower electrode 13L and upper electrode 13U, a lower dark space 19L between the lower electrode 13L and plasma region 18, and an upper dark space region 19U between the upper electrode 13U and plasma region 18. Dark space regions 19* are also known as "sheath" regions. Electrons emitted from the electrodes 13* are accelerated into the discharge region. By the time the electrons have reached plasma region 18, they have acquired sufficient kinetic energy to ionize some of the molecular gas molecules and raise the electrons of other molecular gas molecules to less-stable atomic orbitals of increased energy through a mechanism known as electron impact excitation. As each of these excited electrons "relaxes" and falls back to a more stable orbital, a quantum of energy is released in the form of light. This light gives the plasma region its characteristic glow. Free electrons may also collide with species already formed by collisions between free electrons and gas molecules, leading to additional subspecies. Because free electrons have little mass, they are accelerated much more rapidly toward the electrodes than are ionized gas molecules, leaving the plasma with a net positive charge. The voltage drop through the plasma is small in comparison to the voltage drops between the plasma and either of the plates at any given instant of an AC voltage cycle. Therefore, plasma ions which are accelerated from the plasma to one of the plates are primarily those that happen to be on the edge of one of the dark spaces. Acceleration of ions within the plasma region is minimal. Although ions are accelerated toward both electrodes, it is axiomatic that the smaller of the two electrodes will receive the greatest ionic bombardment. Since the ions are accelerated substantially perpendicularly between the two electrodes (parallel to the electric field), the ions will collide with the wafer perpendicularly to the wafer's surface. As an ion collides with an atom or molecule of reactive material on the wafer, the two may react to form a reaction product. Because ion bombardment of the electrodes with ions and electrons causes an elevation of electrode temperature, both electrodes are normally cooled by the circulation of deionized water through the electrodes and an external temperature control unit (not shown). Water cooling prevents elevation of wafer temperature to levels which would destabilize photoresist. Typical plasma reactors consist of a single process chamber flanked by two loadlock chambers (one for wafer isolation during loading, the other for isolation during unloading).

Parallel-plate etch reactors have fallen into disfavor for certain applications. For example, the voltage required to sustain the plasma is far higher that is required to etch polycrystalline silicon or single-crystal silicon. In fact, the voltage is so high that ions are accelerated to energies sufficient to etch silicon dioxide. For this reason, it is very difficult to perform an etch of silicon that stops on a silicon dioxide layer using a parallel-plate reactor. For such applications, a new type of plasma reactor has been developed. In this type of reactor, the plasma is generated in a source chamber remote from the wafer (typically at the very top of the chamber, and the wafer chuck is powered separately from the plasma source generator. Such a reactor is generally called a high-density source plasma reactor. Examples of sources used to create the high-density plasma are: a Mori source, a helicon source, and an electron cyclotron resonance (ECR) source. A description of the operation of such sources is beyond the scope of this disclosure, and not particularly relevant thereto.

FIG. 2 is a diagrammatic representation of a typical high-density-source plasma reactor. The reactor comprises an etch chamber 21 formed by a cylindrical sidewall 22, which is grounded, a floor wall 23, and a ceiling wall 24. A source chamber 25 adjoins the etch chamber 21. A disc-shaped wafer chuck 26 is concentrically mounted within the lower portion of the etch chamber 21. A wafer 27 is precisely centered on the wafer chuck 26, thereby becoming electrically integrated therewith. The wafer may be held in place against the wafer chuck 26 by any one of a variety of known techniques, such as the use of a clamping ring 28, or an electrostatic chuck (not shown). The flow of molecular gas, which is depicted as being introduced into the source chamber 25 through a primary manifold 29, is automatically regulated by highly-accurate mass-flow controllers 30. However, molecular gases and/or atomic gases may be introduced at other locations in either the source chamber 25 or the etch chamber 21. A high-density plasma 31 is generated within the source chamber 25 by either a Mori source, a helicon source, or an ECR source (not shown). A radio-frequency voltage generator 32 is coupled between the wafer chuck 26 and ground. Chamber pressure is monitored and maintained continuously through a feedback loop between a chamber manometer 33 and a downstream throttle valve 34, which allows reactions products and surplus gas to escape in controlled manner. As the high-density plasma escapes from the source chamber 25 and migrates toward the etch chamber 21, its density usually decreases and it usually becomes more spacially uniform. The less dense plasma 35 within the etch chamber 21 receives additional power from the powered wafer chuck during the etch process. Power coupling between the wafer chuck 26 and the cylindrical sidewall 22 causes reactive ions to be accelerated through a dark space that is established just above the surface of the wafer 27, permitting ion-assisted etching of etchable material on the surface of the wafer to occur. The amount of power supplied to the wafer chuck 26 greatly influences etch rates, etch uniformity, and profile control. The discussion of ion-assisted etching relative to the parallel-plate etch reactor is also largely applicable in the case of a high-density source plasma reactor.

Still referring to FIG. 2, it should be noted that the cylindrical sidewall 22 is normally fitted with a large number of vertical magnetic strips of alternating polarity, thus creating a magnetic field wall on the interior surface of cylindrical sidewall 22. Such an arrangement is known as a "McKenzie bucket" or simply a "confinement bucket", and was devised as a means to more evenly distribute reactive ions which were generated within the source chamber 25 and which have migrated downward to the etch chamber 21. This feature is not depicted, as it is not relevant to this invention.

One of the problems associated with high-density source plasma etch reactors is that etching is not uniform across the surface of the wafer. Nonuniform power coupling between the wafer and the walls of the etch chamber can be the dominant cause of nonuniform etching rates across the surface of the wafer. Nonuniform power coupling occurs because regions near wafer edge are physically closer to the grounded walls of the chamber than are regions closer to the wafer center. Thus, higher power is coupled to the walls through a unit area near the edge of the wafer than is coupled by a unit area located nearer the center of the wafer. This radially nonuniform coupling of the rf power to the chamber walls results in lower etch rates near the center of the wafer than near the edge. It can also adversely affect: other process results such as feature profile and/or selectivity.

SUMMARY OF THE INVENTION

This invention is a hardware modification which permits greater uniformity of etching to be achieved in a high-density-source plasma reactor (i.e., one which uses a remote source to generate a plasma, and which also uses high-frequency bias power on the wafer chuck). The invention addresses the uniformity problem which arises as the result of nonuniform power coupling between the wafer and the walls of the etch chamber. The solution to greatly mitigate the nonuniformity problem is to increase the impedance between the wafer and the chamber walls. This may be accomplished by placing a cylindrical dielectric wall around the wafer. Quartz is a dielectric material that is ideal for the cylindrical wall if silicon is to be etched selectively with respect to silicon dioxide, as quartz it is virtually inert under such conditions. Any dielectric material can be used, including those which are etchable, provided that they do not have a negative impact on the etch process.

PREFERRED EMBODIMENT OF THE INVENTION

Figure 1:
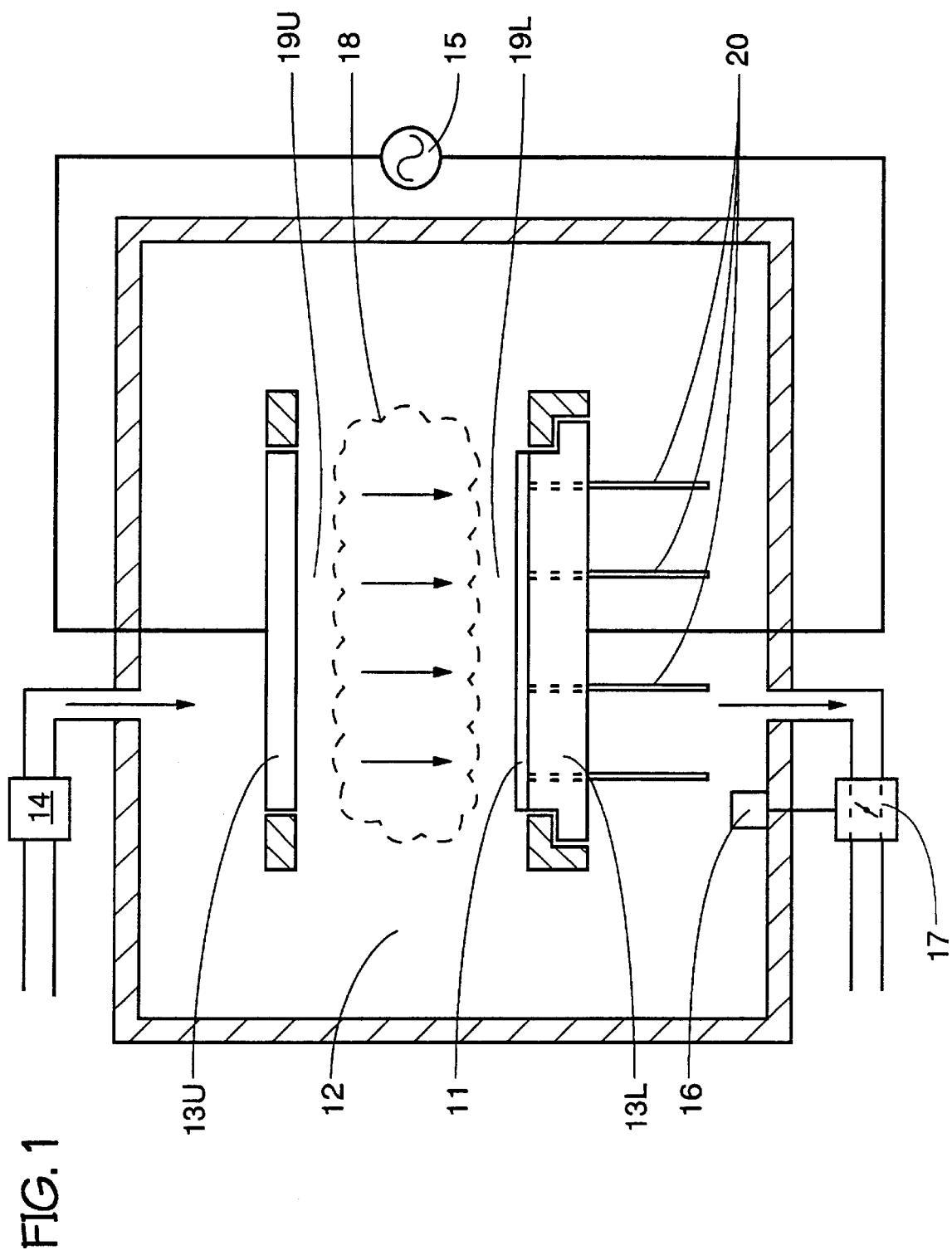
FIG. 1 is a diagrammatic representation of a typical parallel-plate plasma etch reactor.
Figure 2:
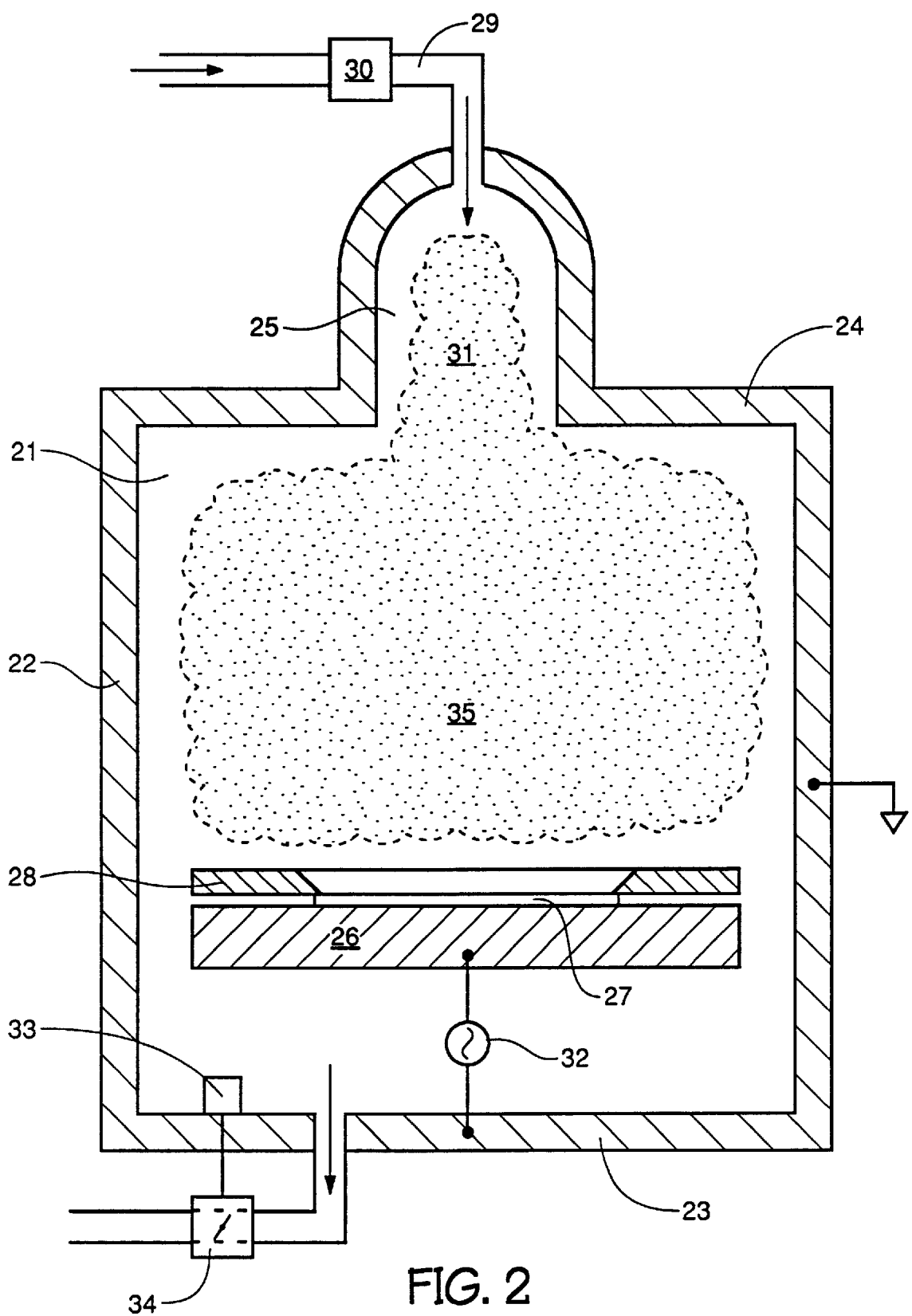
FIG. 2 is a diagrammatic representation of a typical remote plasma source etch reactor having a powered wafer chuck.
Figure 3:
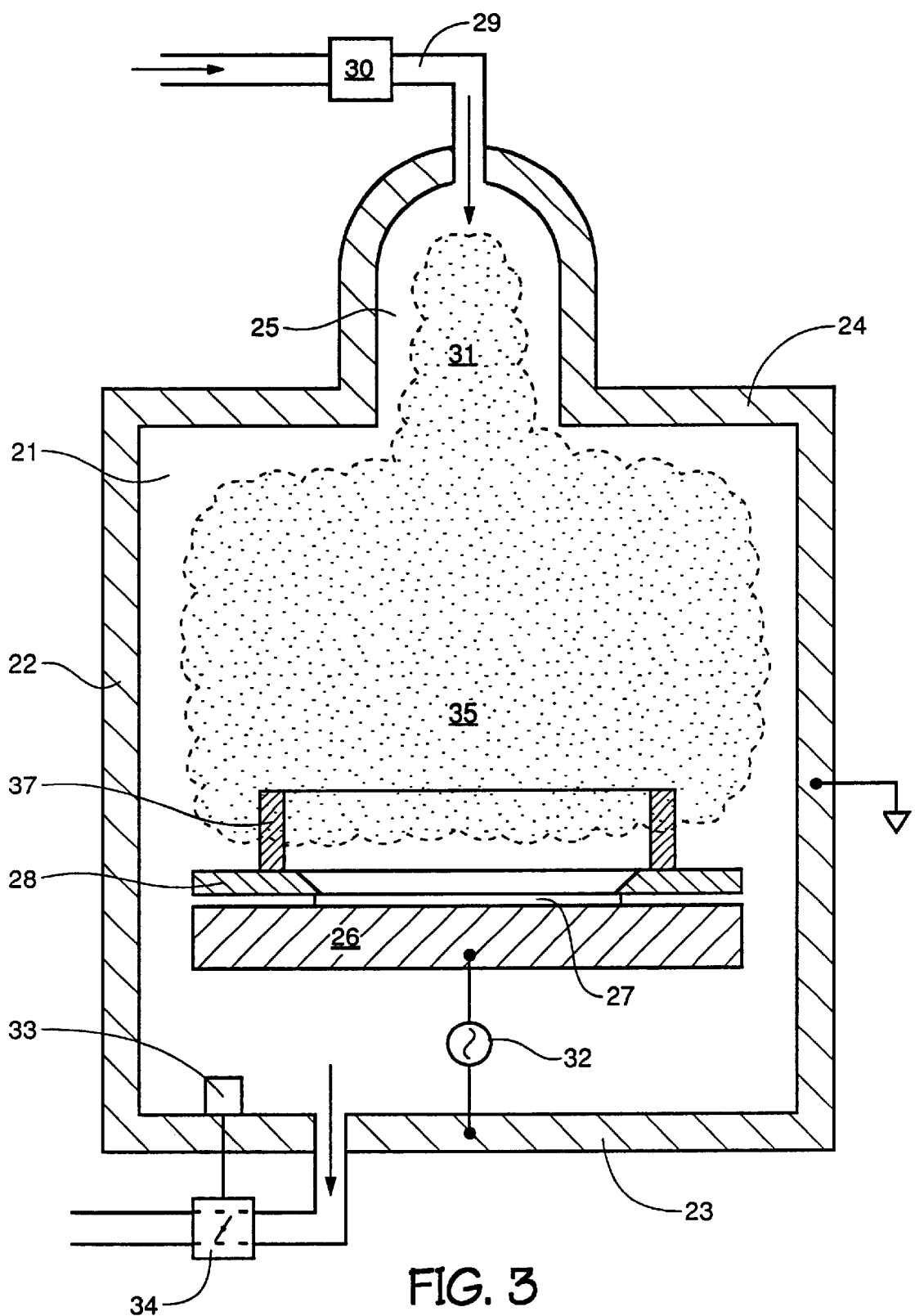
FIG. 3 is a diagrammatic representation of the remote plasma source etch reactor of FIG. 2, which has been fitted with a cylindrical dielectric wall decoupler.

Referring now to FIG. 3, a conventional high-density-source plasma reactor has been fitted with a device which uniformly increases the impedance between the wafer and the chamber walls. The impedance-increasing device is a cylindrical dielectric wall 37 that, like the wafer 27, is precisely centered (i.e., concentrically mounted) on the wafer chuck 26. As shown in FIG. 3, cylindrical dielectric wall has a height extending above an upper surface of wafer 27, and has an inner wall substantially perpendicular to a plane defined by an upper surface of wafer 27. Quartz is a dielectric material that is ideal for the cylindrical wall 37 if silicon is to be etched selectively with respect to silicon dioxide, as quartz it is virtually inert under wafer chuck power settings of 60 watts. It is hypothesized that power coupling between the wafer and the chamber wall 22 is uneven because the electrical paths from the wafer surface, through the dark space above the wafer surface, through the plasma 35, and, finally, to the chamber wall 22, are of different lengths, depending on the radial location on the surface of the wafer. The center of the wafer is the farthest from the wall, so one would expect power coupling for the wafer's center region to be less than for the wafer's edge. Actual etch rates do support this hypothesis. It is assumed that the dielectric wall 37 is successful in improving the uniformity of etch rate because it increase the power coupling path for all portions of the wafer 27. However, the increase in path length is greater for portions of the wafer nearest the edge.

Figure 4A:
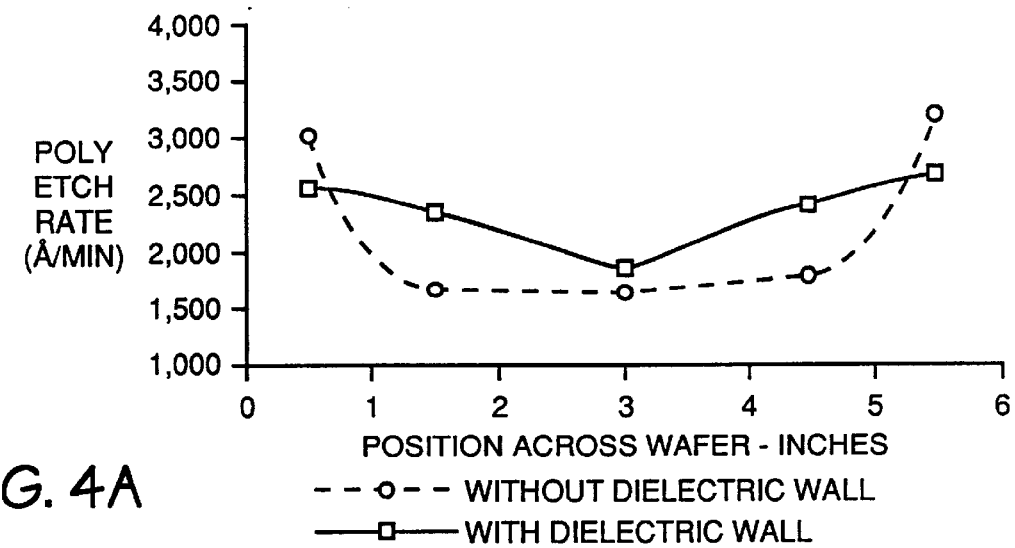
FIG. 4A is a plot of the etch rate for polycrystalline silicon, in Å/min., as a function of location on the wafer for a power setting of 3,000 watts for the source plasma generator and about 95 watts for the wafer chuck power setting for both a standard high-density source plasma reactor and a high-density source plasma reactor which incorporates the invention.
Figure 4B:
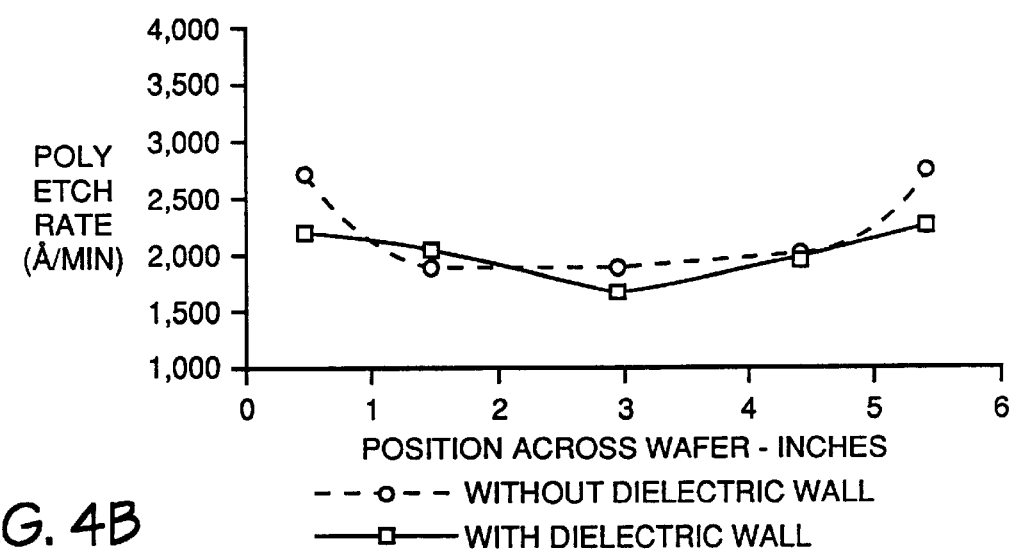
FIG. 4B is a plot of the etch rate for polycrystalline silicon, in Å/min., as a function of location on the wafer for a power setting of 3,000 watts for the source plasma generator and about 60 watts for the wafer chuck power setting for both a standard high-density source plasma reactor and a high-density source plasma reactor which incorporates the invention.
Figure 4C:
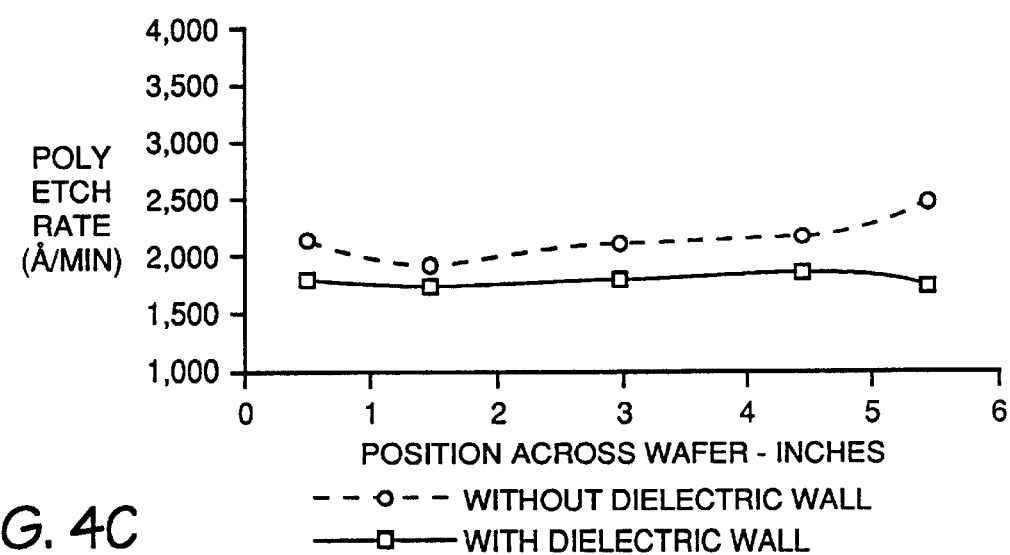
FIG. 4C is a plot of the etch rate for polycrystalline silicon, in Å/min., as a function of location on the wafer for a power setting of 3,000 watts for the source plasma generator and about 31 watts for the wafer chuck power setting for both a standard high-density source plasma reactor and a high-density source plasma reactor which incorporates the invention.

FIGS. 4A, 4B, and 4C demonstrate the effectiveness of the invention at a plasma source power setting of 3,000 watts, but at different wafer chuck power settings. In these figures, the circular data points represent measured data for the standard reactor without the dielectric wall 37, and the square data points represent measured data for the reactor with the dielectric wall 37.

FIG. 4A is a plot of the etch rate for polycrystalline silicon, in Å/min., as a function of location on a six-inch wafer. Position 3 represents the center of the wafer, and positions 0 and 6 represent the edges of the wafer. For the data represented by FIGS. 4A, 4B, and 4C the wafer chuck power settings were approximately 95 watts, 60 watts, and 31 watts, respectively. Per a 6 inch (or 15.24 cm) diameter wafer, as designated by the x-axis of FIGS. 4A–4C, the respective 95 watt, 60 watt, and 31 watt power settings provide approximate average power densities across the wafer of 520 mW/cm$^2$, 330 mW/cm$^2$ and 170 mW/cm$^2$ respectively. Per a 6 inch (or 15.24 cm) diameter wafer, as designated by the x-axis of FIGS. 4A–4C, the respective 95 watt, 60 watt, and 31 watt power settings provide approximate average power densities across the wafer of 520 mW/cm$^2$, 330 mW/cm$^2$ and 170 mW/cm$^2$ respectively. It will be noted that at a wafer chuck power setting of approximately 95 watts, etch uniformity is measurably improved with the dielectric wall 35 installed in the reactor. However, substantial nonuniformity is still present. Although the higher the wafer chuck power setting, the more rapid the etch, this improvement in etch uniformity may not be sufficient for the process concerned. At a wafer chuck power setting of approximately 60 watts, etch uniformity with the dielectric wall 35 installed is greatly improved over that obtained with the standard reactor. At a wafer chuck power setting of approximately 31 watts, nonuniformity of the etch with the dielectric wall 35 installed may not even be accurately measurable.

Although only a single embodiment of the invention has been disclosed herein, it will be obvious to those having ordinary skill in the art of ion-assisted etching that changes and modifications may be made thereto without departing from the scope and the spirit of the invention as hereinafter claimed.

What is claimed is:

1. A plasma etch reactor comprising:
   an etch chamber defined at least in part by cylindrical sidewalls;
   a plasma source in communication with said etch chamber for generating and supplying a plasma to said etch chamber;
   a wafer chuck for receiving a wafer, the wafer chuck disposed concentrically between the cylindrical sidewalls;
   a radio-frequency voltage source electrically coupled between the wafer chuck and the cylindrical sidewalls of the etch chamber to provide an electric field in the etch chamber between a wafer placed on the wafer chuck and said sidewalls; and
   a dielectric ring comprising an upright inner radial wall disposed in adjacent, concentric and external relationship to a circumference of a wafer placed on the wafer chuck, and extending substantially perpendicularly above a plane defined by an upper surface of the wafer.

2. A plasma etch reactor according to claim 1, wherein the dielectric ring comprises quartz.

3. A plasma etch reactor according to claim 1, wherein said wafer chuck is an electrostatic wafer chuck.

4. A plasma reactor comprising:
   a housing comprising cylindrical sidewalls and first and second interior regions, said second interior region between said cylindrical sidewalls, said first interior region in fluid communication with said second interior region;
   a wafer chuck having a first surface for receiving a wafer, said wafer chuck disposed coaxially between said cylindrical sidewalls;
   at least one gas manifold coupled to said housing to supply at least one gas to within said housing;
   a first energy source functionally configured to supply first energy to said first interior region for exciting said gas and generating a plasma within said first interior region;
   a second energy source electrically coupled between said wafer chuck as a first electrode and said cylindrical sidewalls of said housing as a second electrode, and operable to provide electromagnetic fields therebetween to accelerate ions of plasma within said second interior region; and
   a cylindrical dielectric ring comprising an inner radial wall that extends above said wafer chuck and in concentric relationship relative to a wafer upon said wafer chuck, said inner radial wall having a height that extends substantially perpendicularly above a plane defined by an upper surface of said wafer.

5. A plasma reactor according to claim 4, wherein said first interior region is disposed above said second interior region.

6. A plasma reactor according to claim 5,
   wherein said housing includes a ceiling over said first interior region; and
   wherein said gas manifold is coupled to said ceiling, enabling supply of said gas to said housing proximate said first interior region.

7. A plasma reactor according to claim 4, wherein said first energy source comprises one of a helicon source, or an electron cyclotron resonance (ECR) source.

8. A plasma reactor according to claim 7, wherein said second energy source provides a radio-frequency voltage bias to said wafer chuck relative said cylindrical sidewalls of said housing.

9. A plasma reactor according to claim 4 wherein said inner radial wall of said cylindrical dielectric ring has a diameter greater than a diameter of said wafer.

* * * * *